(12) United States Patent
Wang et al.

(10) Patent No.: US 8,900,974 B2
(45) Date of Patent: Dec. 2, 2014

(54) HIGH YIELD SUBSTRATE ASSEMBLY

(75) Inventors: Liang Wang, Milpitas, CA (US); Ilyas Mohammed, Santa Clara, CA (US); Masud Beroz, Morrisville, NC (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 13/462,676

(22) Filed: May 2, 2012

(65) Prior Publication Data

US 2013/0126867 A1 May 23, 2013

Related U.S. Application Data

(63) Continuation-in-part of application No. 13/299,672, filed on Nov. 18, 2011.

(51) Int. Cl.
| | | |
|---|---|---|
| H01L 21/20 | (2006.01) | |
| H01L 21/36 | (2006.01) | |
| H01L 23/00 | (2006.01) | |
| H01L 33/00 | (2010.01) | |
| H01L 25/00 | (2006.01) | |
| H01L 21/683 | (2006.01) | |

(52) U.S. Cl.
CPC .............. *H01L 33/005* (2013.01); *H01L 24/19* (2013.01); *H01L 2924/13091* (2013.01); *H01L 33/0062* (2013.01); *H01L 25/50* (2013.01); *H01L 21/6835* (2013.01)
USPC .......................................... 438/478; 438/400

(58) Field of Classification Search
None
See application file for complete search history.

(56) References Cited

U.S. PATENT DOCUMENTS

| | | | |
|---|---|---|---|
| 5,403,783 | A | 4/1995 | Nakanishi et al. |
| 5,940,683 | A | 8/1999 | Holm et al. |
| 6,214,733 | B1 | 4/2001 | Sickmiller |
| 6,485,993 | B2 | 11/2002 | Trezza et al. |
| 6,998,926 | B2 | 2/2006 | Miyazaki et al. |
| 7,338,827 | B2 * | 3/2008 | Sugahara et al. ............... 438/41 |
| 2003/0170965 | A1 | 9/2003 | Kondo |
| 2004/0134416 | A1 | 7/2004 | Furuyama |
| 2005/0153522 | A1 | 7/2005 | Hwang et al. |
| 2006/0223330 | A1 * | 10/2006 | Fudeta et al. ................. 438/752 |
| 2007/0281375 | A1 | 12/2007 | Ibe et al. |
| 2008/0102598 | A1 * | 5/2008 | Herman et al. ............... 438/424 |
| 2009/0130821 | A1 | 5/2009 | Cox et al. |
| 2010/0025711 | A1 | 2/2010 | Barnes et al. |
| 2011/0049694 | A1 | 3/2011 | Chandrasekaran et al. |

* cited by examiner

*Primary Examiner* — Andres Munoz

(57) ABSTRACT

High yield substrate assembly. In accordance with a first method embodiment, a plurality of piggyback substrates are attached to a carrier substrate. The edges of the plurality of the piggyback substrates are bonded to one another. The plurality of piggyback substrates are removed from the carrier substrate to form a substrate assembly. The substrate assembly is processed to produce a plurality of integrated circuit devices on the substrate assembly. The processing may use manufacturing equipment designed to process wafers larger than individual instances of the plurality of piggyback substrates.

21 Claims, 7 Drawing Sheets

100

110, 120 or 130

100

110

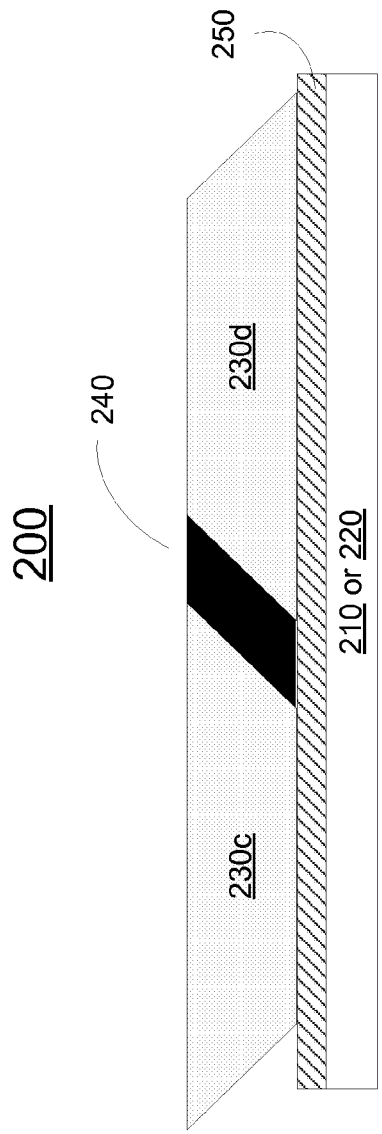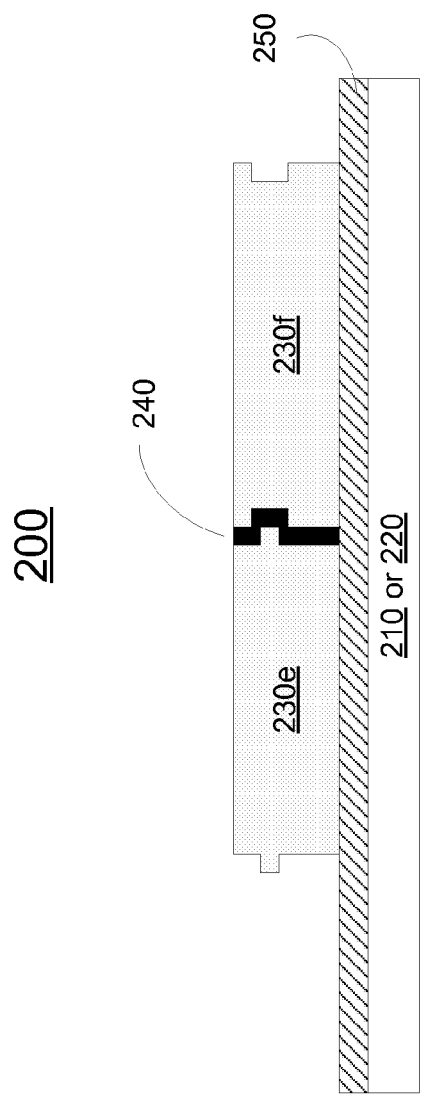

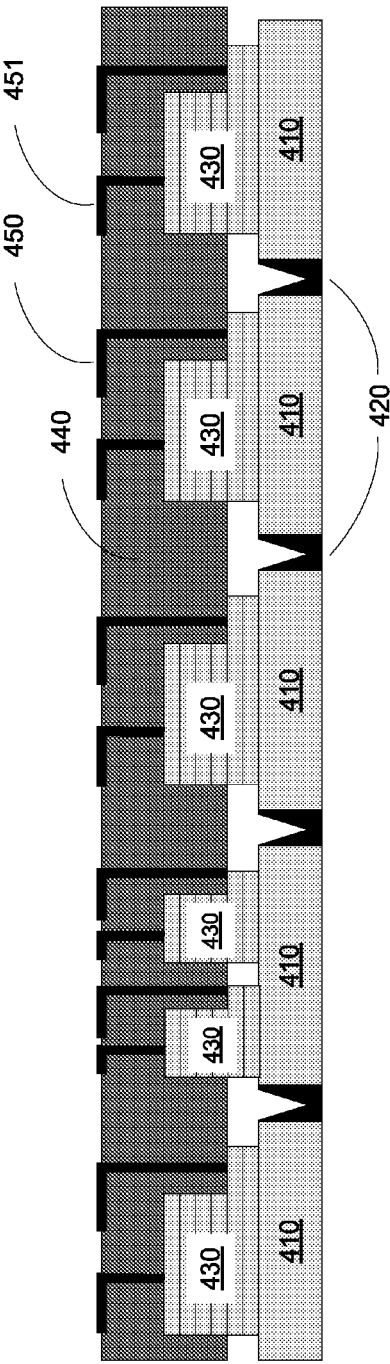
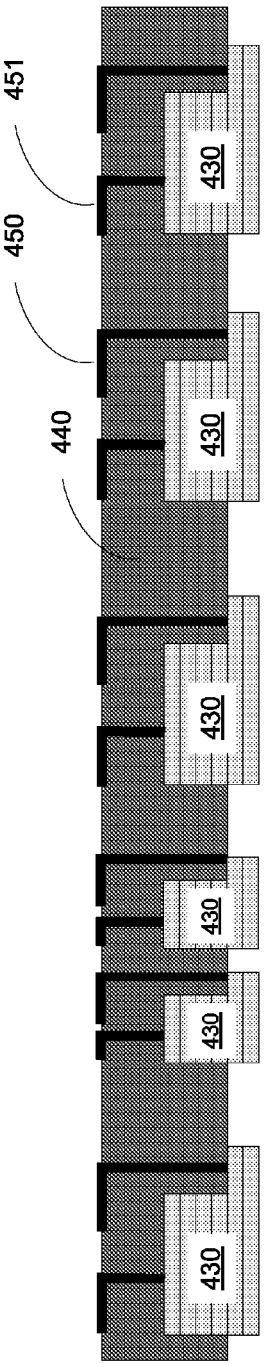
Figure 4C
Figure 4D

HIGH YIELD SUBSTRATE ASSEMBLY

RELATED APPLICATION

This application is a Continuation in Part of, and claims priority to co-pending, commonly-owned U.S. patent application Ser. No. 13/299,672, entitled, "Front Facing Piggyback Wafer Assembly," filed Nov. 18, 2011, to Mohammed et al., which is hereby incorporated herein by reference in its entirety.

FIELD OF INVENTION

Embodiments of the present invention relate to the field of integrated circuit design and manufacture. More specifically, embodiments of the present invention relate to systems and methods for high yield substrate assemblies.

BACKGROUND

Silicon is the most common substrate material utilized for integrated circuit fabrication. Accordingly, much of the fabrication process machinery is targeted for use with Silicon. The current state of the art fabrication facilities utilize 200 mm ("8 inch") to 300 mm ("12 inch") diameter Silicon wafers. In general, a fabrication facility and a fabrication process are more efficient, e.g., produce more integrated circuits in less time and/or at a lower cost, using a larger wafer size.

A variety of integrated circuit devices benefit from, or require, non-Silicon substrates, for example, light emitting diodes or lasers, optical waveguides, radio-frequency circuits, low power circuitry or radiation hardened circuitry. Wafers grown using materials other than Silicon are generally only available in smaller wafer sizes, for a variety of reasons including crystal growth characteristics, mechanical strength, thermal properties, defect propagation, and the like. For example, such non-Silicon wafers are generally not available in sizes over 100 mm.

One obstacle to the adoption of large, non-Silicon substrates may be the behavior of defects in an epitaxial layer grown on the substrate. Such defects may be caused by a lattice mismatch or a coefficient of thermal expansion (CTE) mismatch between a substrate and an epitaxial layer. When substrate size becomes larger, lattice-mismatch-induced defects propagate along an epitaxial layer, and the amount of thermal-expansion difference is larger. Both of these effects may lead to a deleteriously higher defect ratio and poor production yield when using "large" non-Silicon substrates.

SUMMARY OF THE INVENTION

Therefore, what is needed are systems and methods for high yield substrate assemblies. What is additionally needed are systems and methods for high yield substrate assemblies that enable relatively smaller substrates to benefit from process machinery optimized for larger substrates. A further need exists for systems and methods for high yield substrate assemblies that are compatible and complementary with existing systems and methods of integrated circuit design, manufacturing and test. Embodiments of the present invention provide these advantages.

In accordance with a first method embodiment, a plurality of piggyback substrates are attached to a carrier substrate. The edges of the plurality of the piggyback substrates are bonded to one another. The plurality of piggyback substrates are removed from the carrier substrate to form a substrate assembly. The substrate assembly is processed to produce a plurality of integrated circuit devices on the substrate assembly. The processing may use manufacturing equipment designed to process wafers larger than individual instances of the plurality of piggyback substrates.

In accordance with a second method embodiment, a plurality of structures are created to, e.g., in or on, a surface of a substrate to form a substrate assembly. A layer of crystalline material is formed on the surface. The crystalline material accesses a crystal pattern of the substrate. After the creating, the substrate assembly is processed to produce a plurality of integrated circuit devices on the crystalline material. The structures interrupt a crystal pattern of the crystalline material. The plurality of structures may be operable to relieve thermal stress across the substrate during the processing.

In accordance with another embodiment of the present invention, an article of manufacture includes a substrate assembly configured for formation of integrated circuit device structures thereon. The substrate assembly includes a plurality of substrates bonded to one another on edges of the plurality of substrates. The substrate assembly is configured for use with integrated circuit manufacturing equipment designed to process wafers larger than individual instances of the plurality of substrates. The substrate assembly may have a width or diameter of greater than 200 mm, and may be rectangular.

In accordance with still another embodiment of the present invention, an article of manufacture includes a substrate having a surface. The surface comprises a plurality of structures formed thereon. The plurality of structures are operable to relieve thermal stress across the substrate during integrated circuit processing. The plurality of structures may interrupt a crystal structure of the surface, and may comprise substrate material that is characterized as amorphous.

BRIEF DESCRIPTION OF THE DRAWINGS

The accompanying drawings, which are incorporated in and form a part of this specification, illustrate embodiments of the invention and, together with the description, serve to explain the principles of the invention. Unless otherwise noted, the drawings are not drawn to scale.

FIG. 2C illustrates a side-sectional view of a carrier substrate with a plurality of piggyback substrates, in accordance with embodiments of the present invention.

FIG. 2D illustrates a side-sectional view of a carrier substrate with a plurality of piggyback substrates, in accordance with embodiments of the present invention.

FIGS. 4A, 4B, 4C and 4D illustrate an exemplary method of manufacturing a plurality of Gallium Nitride (GaN) based light emitting diodes on sapphire portions of a high yield substrate assembly, in accordance with embodiments of the present invention.

DETAILED DESCRIPTION

Figure 1A:
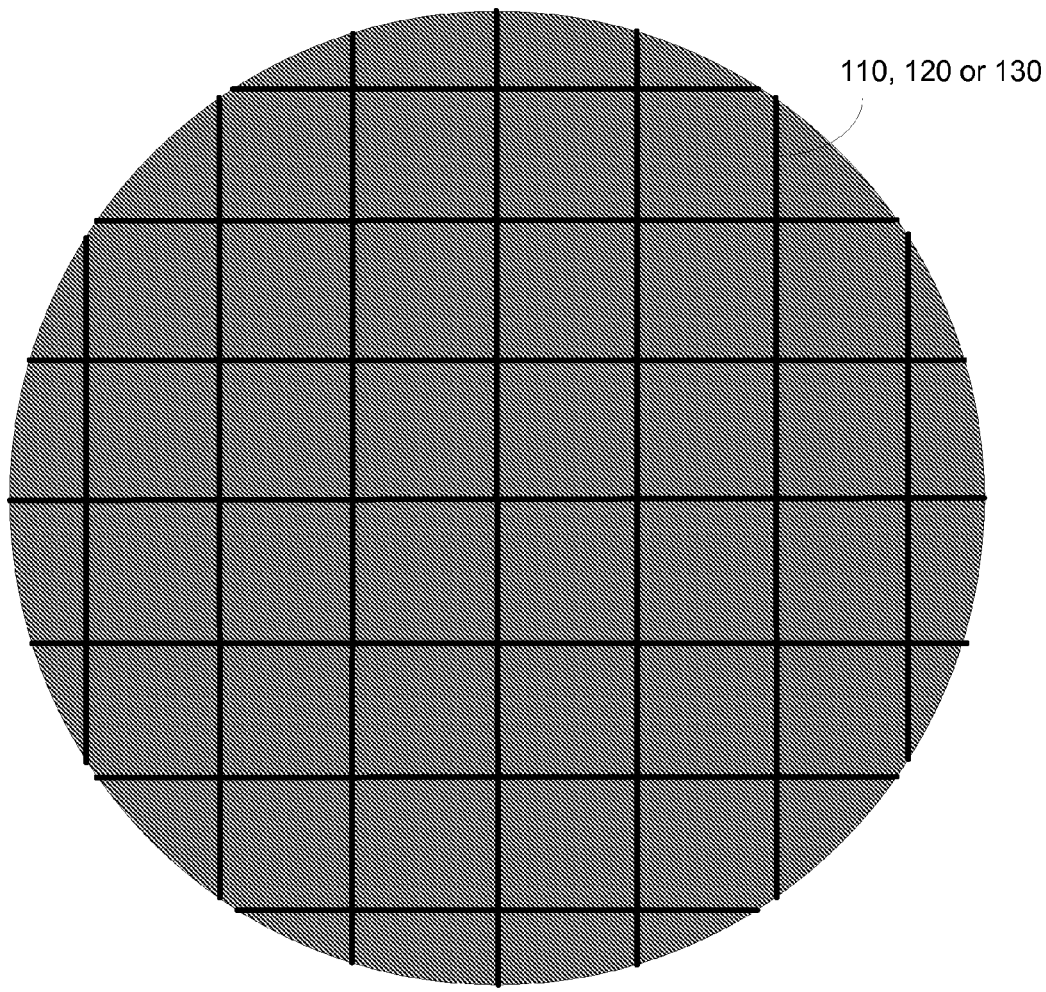
FIG. 1A illustrates a plan view of an exemplary high yield substrate assembly, in accordance with embodiments of the present invention.

Reference will now be made in detail to various embodiments of the present invention, examples of which are illustrated in the accompanying drawings. While the invention will be described in conjunction with these embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, it will be recognized by one of ordinary skill in the art that the invention may be practiced without these specific details. In other instances, well known methods, procedures, components, and circuits have not been described in detail as not to unnecessarily obscure aspects of the invention.

Notation and Nomenclature

Some portions of the detailed descriptions which follow (e.g., process 499) are presented in terms of procedures, steps, logic blocks, processing, and other symbolic representations of operations on data bits that may be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "attaching" or "processing" or "singulating" or "processing" or "forming" or "roughening" or "filling" or "accessing" or "performing" or "generating" or "adjusting" or "creating" or "executing" or "continuing" or "indexing" or "processing" or "computing" or "translating" or "calculating" or "determining" or "measuring" or "gathering" or "running" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

As used herein, the term "carrier" wafer or substrate is not intended to limit the function of such a wafer or substrate. For example, a "carrier wafer" may include a variety of circuits and/or structures, and a "carrier wafer" is not limited to only carrying other structures.

High Yield Substrate Assemblies

FIG. 1A illustrates a plan view of an exemplary high yield substrate assembly 100, in accordance with embodiments of the present invention. High yield substrate assembly 100 may comprise, for example, a wafer of sapphire ($\alpha$-$Al_2O_3$), Gallium Nitride (GaN), Gallium Arsenide (GaAs), Gallium Phosphide (GaP), Lithium Tantalate ($LiTaO_3$), Lithium Niobate ($LiNbO_3$), Indium Arsenide (InAs), Indium Phosphide (InP), Silicon Carbide (SiC), or Germanium (Ge). Wafer flats or notches, if any, are not illustrated. High yield substrate assembly 100 may have any suitable diameter, including a diameter larger than conventional wafers of such materials. For example, high yield substrate assembly 100 may have a diameter greater than 100 mm. For example, high yield substrate assembly 100 may have a diameter of 200 mm ("8 inches") to 300 mm ("12 inches").

Figure 1B:
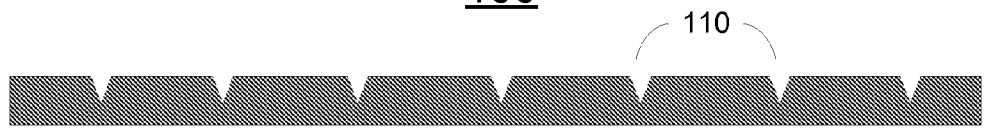
FIG. 1B illustrates a side-sectional view of an exemplary high yield substrate assembly with trenches, in accordance with embodiments of the present invention.

FIG. 1B illustrates a side-sectional view of an exemplary high yield substrate assembly 100 with trenches 110, in accordance with embodiments of the present invention. A plurality of trenches 110 are formed into a surface of high yield substrate assembly 100. Trenches 110 may be formed by any suitable process, including, for example, mechanical marking and/or chemical etching by means of wet or dry etching in association with photo-lithographic patterning. Trenches 110 may also be formed by "non-contact" methods including, for example, ultrasonic welding, radio frequency (RF) heating, e-beams, ion beams and/or optical energy, e.g., lasers.

It is to be appreciated that a variety of processes may occur in association with formation of trenches 110. For example, substrate material may be removed, substrate material may be heated or melted, substrate material may reflow and/or substrate material may re-solidify. In general, the crystal orientation of the surface of high yield substrate assembly 100 will be interrupted by trenches 110. For example, substrate material may be removed or the substrate material in a trench 110 may be made amorphous. Trenches 110 may be formed to any suitable depth and to any preferable cross-sectional profile. In accordance with embodiments of the present invention, trenches 110 may be formed to a depth below the substrate surface about the same as the thickness above the substrate surface of subsequent semiconductor devices. For example, if a light emitting diode device formed on a substrate is to be 5 micrometers in thickness, the trench may be 5 micrometers deep.

It is appreciated that the shape of trenches 110 illustrated in FIG. 1B, e.g., triangular, is exemplary, and not limiting. Trenches 110 may have any suitable cross-sectional shape, including, e.g., rectangular, trapezoidal, oval and the like, including complex shapes in combination, in accordance with embodiments of the present invention.

In accordance with embodiments of the present invention, trenches 110 may relieve mechanical and/or thermal stresses imposed upon high yield substrate assembly 100 during integrated circuit processing. For example, integrated circuit manufacturing processes generally include repeated thermal cycling of a substrate. Such repeated thermal cycles may build up stresses and/or defects in the device stack built on a substrate. Trenches 110 may relieve such mechanical and/or thermal stresses and/or limit the extent of defects related to such mechanical and/or thermal stresses.

It is to be appreciated that crystalline materials applied or grown on a substrate generally follow the crystal structure of the substrate. Accordingly, in regions of a substrate that have a discontinuous, or interrupted, crystal structure, crystalline materials on such a substrate may also have a discontinuous, or interrupted, crystal structure corresponding to such interruptions of the substrate. Trenches 110, formed in a substrate, may cause interruptions in a crystal orientation of materials applied or grown on the high yield substrate assembly 100. As a result, defects occurring in the crystalline layer grown atop the substrate surface and otherwise propagating along the surface may be stopped by the trenches 110 and thus confined inside the border defined by trenches 110.

It is to be appreciated that any subsequent integrated circuit devices formed on substrate assembly 100 generally will not use trenches 110. For example, such integrated circuit devices are independent of the trenches 110. For example, trenches 110 are not trenches as utilized in vertical trench MOSFET devices.

It is to be appreciated that the sizes, and number of regions formed by, e.g., separated by, trenches 110 is exemplary. There may be many more regions of a smaller size, e.g., of one millimeter edge or less, in accordance with embodiments of the present invention.

Figure 1C:
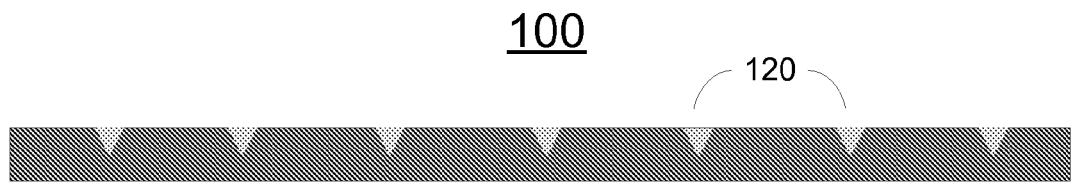
FIG. 1C illustrates a side-sectional view of an exemplary high yield substrate assembly with lines, in accordance with embodiments of the present invention.

FIG. 1C illustrates a side-sectional view of an exemplary high yield substrate assembly 100 with lines 120, in accordance with embodiments of the present invention. Lines 120 may be located in positions similar to those of trenches 110 (FIG. 1B). Lines 120 are amorphous portions of substrate material, formed, for example, by localized heating, e.g., via a laser. Lines 120 may relieve mechanical and/or thermal stresses occurring within a device stack upon high yield substrate assembly 100 during integrated circuit processing. For example, the crystal structure of the substrate is interrupted by the amorphous material of lines 120. Lines 120 may be formed to any suitable depth, e.g., to provide a sufficient interruption in the crystal structure of a substrate. In accordance with embodiments the present invention, lines 120 may be formed to depth of 100 nm.

It is to be appreciated that crystalline materials applied or grown on a substrate generally follow the crystal structure of the substrate. Accordingly, in regions of a substrate that have a discontinuous, or interrupted, crystal structure, crystalline materials on such a substrate may also have a discontinuous, or interrupted, crystal structure corresponding to such interruptions of the substrate. Lines 120, formed in a substrate, may cause interruptions in a crystal orientation of materials applied or grown on the high yield substrate assembly 100. As a beneficial result, defects occurring in the crystalline layer grown atop the substrate surface and otherwise propagating along the surface may be stopped by the trenches 110 and thus confined inside the border defined by trenches 110.

It is appreciated that the shape lines 120 illustrated in FIG. 1C, e.g., triangular, is exemplary, and not limiting. Lines 120 may have any suitable cross-sectional shape, including, e.g., rectangular, trapezoidal, oval and the like, including complex shapes in combination, in accordance with embodiments of the present invention.

It is to be appreciated that the sizes, and number of regions formed by, e.g., separated by, lines 120 is exemplary. There may be many more regions of a smaller size, e.g., of one millimeter edge or less, in accordance with embodiments of the present invention.

Figure 1D:
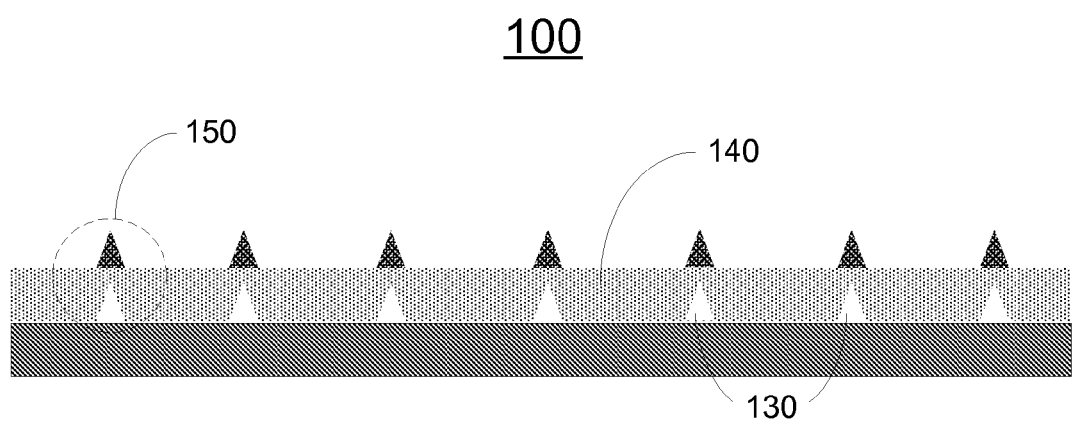
FIG. 1D illustrates a side-sectional view of an exemplary high yield substrate assembly with ridges, in accordance with embodiments of the present invention.

FIG. 1D illustrates a side-sectional view of an exemplary high yield substrate assembly 100 with ridges 130, in accordance with embodiments of the present invention. Ridges 130 may be located in positions similar to those of trenches 110 (FIG. 1B). Ridges 130 are formed on and above a surface of a substrate, from materials with no crystal structure, e.g., amorphous materials, or materials with a different crystal structure than a substrate, including materials with a crystal structure that is incompatible with a crystal structure of materials to be applied or grown on the substrate. Exemplary materials for the formation of ridges 130 include Silicon dioxide ($SiO_2$), Titanium oxide ($TiO_2$), amorphous $Al_2O_3$, and the like.

It is appreciated that the shape of ridges 130 illustrated in FIG. 1D, e.g., triangular, is exemplary, and not limiting. Ridges 130 may have any suitable cross-sectional shape, including, e.g., rectangular, trapezoid, oval and the like, including complex shapes in combination, in accordance with embodiments of the present invention.

It is to be appreciated that crystalline materials applied or grown on a substrate generally follow the crystal structure of the substrate. In accordance with embodiments of the present invention, ridges 130 may cause discontinuities or interruptions in the crystal structure of materials applied or grown on the high yield substrate assembly 100. For example, in regions above ridges 130, a second material may not be able to access the crystal structure of high yield substrate assembly 100. For example, in regions 150, material layer 140 may have discontinuities or interruptions in its crystal structure. Ridges 130 may be of sufficient height to interrupt a crystal structure of the second material, e.g., about 500 nm or higher (thicker).

It is to be appreciated that the sizes, and number of regions formed by, e.g., separated by, ridges 130 is exemplary. There may be many more regions of a smaller size, e.g., of one millimeter edge or less, in accordance with embodiments of the present invention.

Figure 2A:
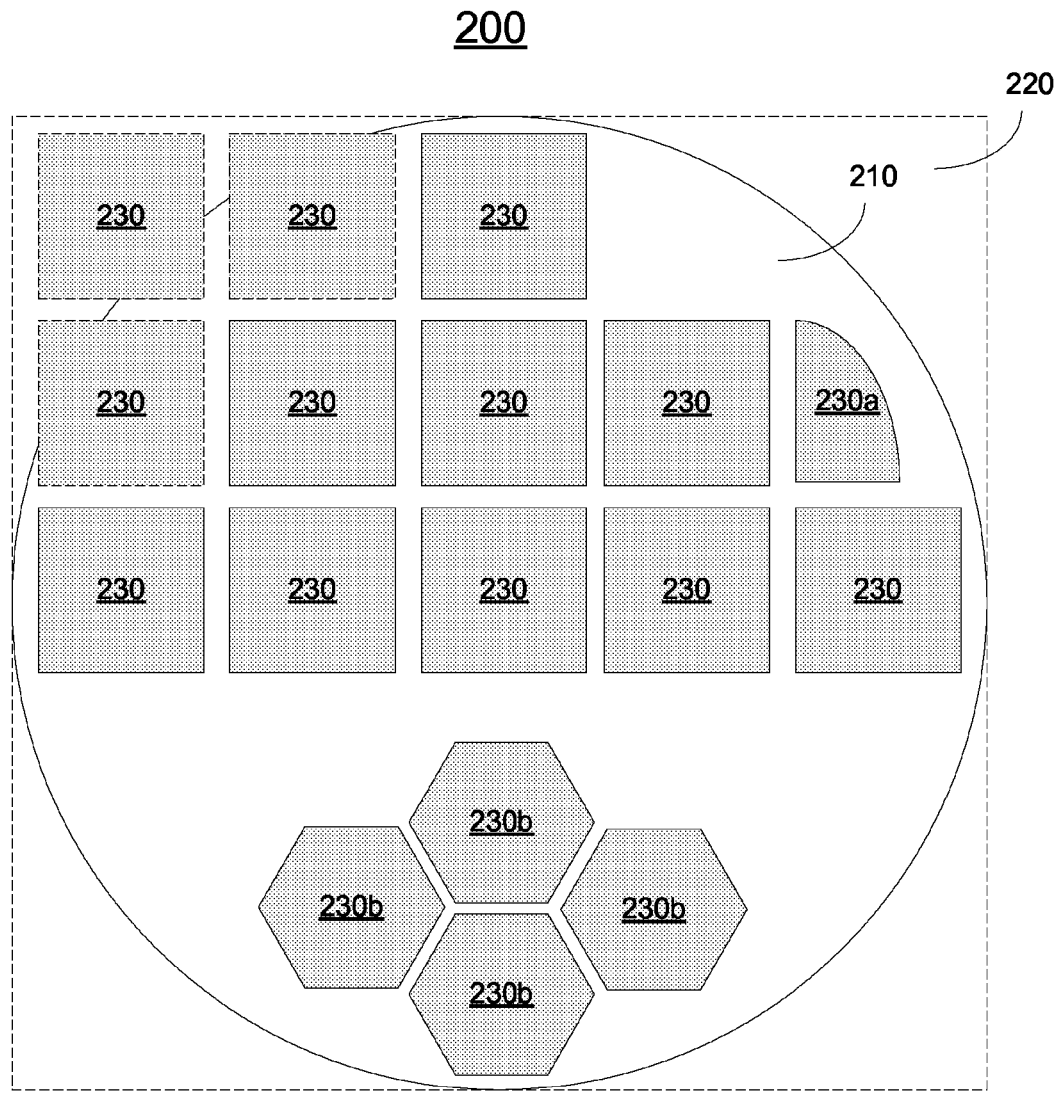
FIG. 2A illustrates a plurality of piggyback substrates attached to a generally circular carrier substrate or a generally rectangular carrier substrate, in accordance with embodiments of the present invention.

FIG. 2A illustrates a plurality of piggyback substrates 230 attached to a generally circular carrier substrate 210 or a generally rectangular carrier substrate 220, in accordance with embodiments of the present invention. Wafer flats or notches, if any, are not illustrated. It is to be appreciated that not all instances of piggyback substrates 230 need to be the same material. It is appreciated that a carrier substrate may be any suitable shape, and the illustrative embodiments are exemplary, and not limiting.

The piggyback substrates 230 may comprise, for example, sapphire ($\alpha$-$Al_2O_3$), Gallium Nitride (GaN), Gallium Arsenide (GaAs), Gallium Phosphide (GaP), Lithium Tantalate ($LiTaO_3$), Lithium Niobate ($LiNbO_3$), Indium Arsenide (InAs), Indium Phosphide (InP), Silicon Carbide (SiC), or Germanium (Ge). The piggyback substrates 230 may be any suitable size or shape, and are not necessarily a full wafer. For example, the piggyback substrates 230 may be formed from pieces of larger wafers.

It is appreciated that he piggyback substrates 230 have much greater extent in length and width dimensions, in comparison to a thickness dimension.

The carrier substrate, either generally circular carrier substrate 210 or generally rectangular carrier substrate 220, may comprise any suitable material. For example, carrier substrate 210 or 220 does not need to comprise a semiconductor material. In accordance with some embodiments of the present invention, the carrier substrate should be suitable for the processing environment of piggyback substrates 230, and may comprise, for example, Silicon, Silicon carbide, glass, quartz, fused silica, metals and the like. If the piggyback substrates 230 are to remain attached to the carrier substrate 210 or 220 during their processing, the carrier substrate 210 or 220 may have a coefficient of thermal expansion similar to that of the piggyback substrates 230. For example, the coefficient of thermal expansion for Tungsten is similar to that of sapphire.

In accordance with other embodiments of the present invention, the carrier substrate is not exposed to the processing environment of piggyback substrates 230.

The piggyback substrates 230 may be bonded to the carrier substrate 210 or 220. A variety of types of bonds and/or bonding materials are well suited to embodiments in accordance with the present invention. For example, some embodiments of the present invention may utilize temporary bonds, e.g., low temperature adhesives, while other embodiments of the present invention may make use of more permanent bonds, e.g., higher temperature adhesives, oxide to oxide bonds, and/or metallurgical bonds.

Figure 2B:
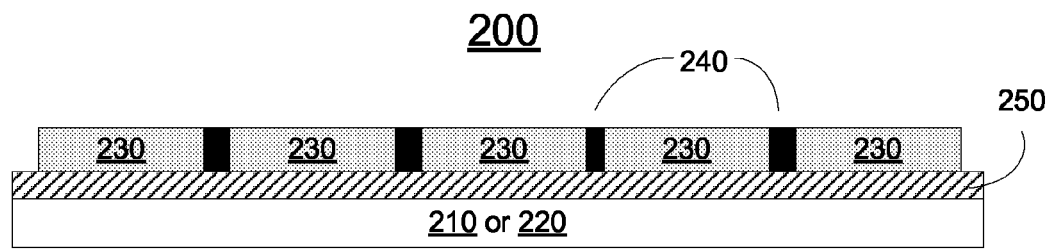
FIG. 2B illustrates a side-sectional view of a carrier substrate with a plurality of piggyback substrates, in accordance with embodiments of the present invention.

FIG. 2B illustrates a side-sectional view of carrier substrate 210 or 220 with a plurality of piggyback substrates 230, in accordance with embodiments of the present invention.

In accordance with embodiments of the present invention, the piggyback substrates 230 may be bonded laterally, on edge, to one or more other piggyback substrates 230. For example, an instance of piggyback substrates 230 may be bonded to only one other instance of piggyback substrates 230, or the one instance may be bonded to all surrounding instances of piggyback substrates 230.

FIG. 2B illustrates an addition of a bond 240 between piggyback substrates 230. The bonds joining piggyback substrates 230 should be suitable for the processing environment of piggyback substrates 230, e.g., for manufacturing GaN based light emitting diodes such bonds should be stable at temperatures of at least 1000° C., for example, 1100° C. The exposed, or top, surface of piggyback substrates 230 and bonds 240 may be polished to provide a smooth surface suitable for the processing of piggyback substrates 230.

Any suitable bonding method and/or material 240 for bonding piggyback substrates 230 together is well suited to embodiments in accordance with the present invention. For example, alumina, e.g., Aluminum oxide nano particles, may be added between piggyback substrates 230 and heated, e.g., locally or globally, to form a bond 240 between piggyback substrates 230. It is to be appreciated that alumina nano particles are very similar to sapphire, and have similar optical and thermal properties, which may be advantageous to subsequent manufacturing processes. Owing to their nanoscale size, alumina nano particles have a melting point lower than that of sapphire and therefore can be used to join sapphire substrates 230 together without melting the sapphire substrates. Other exemplary bonding materials include Aluminum oxynitride (AlON), Nickel-Cobalt ferrous alloys, Nickel, Palladium, or Nickel-Palladium alloys.

Alternatively, in accordance with embodiments of the present invention, the piggyback substrates 230 may be pre-coated, for example, sputtered, e.g., on the edges and/or backside, with a metallization, metal coated ceramic nano particles and/or a polymer. When heated, such coatings may form suitable bonds between piggyback substrates 230 and/or piggyback substrates 230 and carrier substrate 210 or 220.

In accordance with embodiments of the present invention, bond material 240 may be heated globally, e.g. in an oven or on a hot plate, or may be heated locally, e.g. heated by a metal grid carrying an electric current for Joule heating, or treated by a laser beam scanning, to a point of diffusion and/or until bond material 240 forms a covalent bond to a piggyback substrate 230. It is appreciated that bond material 240 does not have to melt, or be melted, in accordance with embodiments of the present invention.

FIG. 2B further illustrates optional decoupling layer 250, interposed between piggyback substrates 230 and carrier substrate 210 or 220. Decoupling layer 250 may comprise a metal, for example, and serves to decouple the carrier substrate 210 or 220 from piggyback substrates 230 during thermal cycling. For example, decoupling layer 250 may help keep piggyback substrates 230 in position during thermal cycling.

It is to be appreciated that the sizes, shapes and number of piggyback substrates is exemplary. For example, a piggyback substrate may be a parallelogrammatic shape. There may be many more regions of a smaller size, and there may be different sizes of pieces, e.g., to fill out edges of a round shape, in accordance with embodiments of the present invention. Piggyback substrate 230a of FIG. 2A illustrates an exemplary different shape. In addition, other shapes, e.g., hexagons 230b or octagons (not shown), are well suited to embodiments in accordance with the present invention.

The piggyback substrates may have any suitable cross-sectional shape. For example, the edge(s) of a piggyback substrate need not be perpendicular to its face. In addition, the edge(s) of all piggy back substrates on a same carrier wafer do not need to have the same shape. In accordance with embodiments of the present invention, piggyback substrates may have edges shaped to improve bonding.

FIG. 2C illustrates a side-sectional view of carrier substrate 210 or 220 with a plurality of piggyback substrates 230c and 230d, in accordance with embodiments of the present invention. Piggyback substrate 230c comprises an edge shape with a descending profile, e.g., the top of piggyback substrate 230c is larger than the bottom of piggyback substrate 230c. Piggyback substrate 230d comprises an ascending edge profile, e.g., the top of piggyback substrate 230d is smaller than the bottom of piggyback substrate 230d.

FIG. 2D illustrates a side-sectional view of carrier substrate 210 or 220 with a plurality of piggyback substrates 230e and 230f, in accordance with embodiments of the present invention. Piggyback substrate 230f comprises a "notch" or indentation in its edge. Piggyback substrate 230e comprises a "tab" or projection from its nominal edge.

In accordance with embodiments of the present invention, piggyback substrate edge shapes such as illustrated in FIGS. 2C and 2D may improve bonding between piggyback substrates. For example, such edge shapes may increase a surface area of a piggyback substrate edge, enabling more bonding material and/or a stronger bond. Any suitable edge shape may be used, including curved edges, roughed edges, and the like. It is also to be appreciated that all edges of a single piggyback substrate do not need to have the same edge shape, in accordance with embodiments of the present invention.

In accordance with embodiments of the present invention, piggyback substrates 230 may be removed, as a group, from carrier substrate 210 or 220 and/or decoupling layer 250, and processed further as though the plurality of piggyback substrates 230 were a single substrate or wafer.

In accordance with embodiments of the present invention, a substrate assembly comprising a plurality of hexagons, or other non-rectangular regular shapes, may be stronger, e.g., more resistant to breakage, due to a variety of different planes of the inter-piggyback substrate bonds, and decreased range of straight-line bond lengths.

Figure 3:
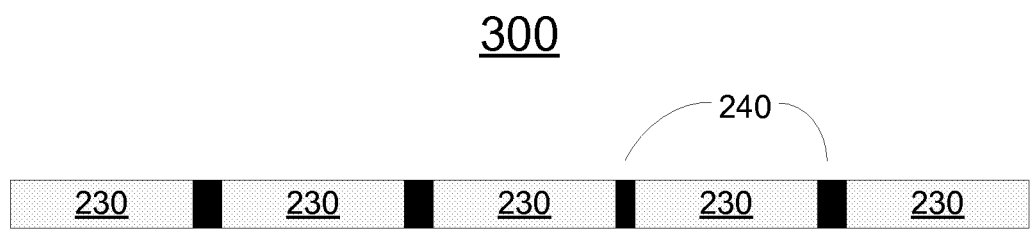
FIG. 3 illustrates a side sectional view of exemplary high yield substrate assembly, in accordance with embodiments of the present invention.

FIG. 3 illustrates a side sectional view of exemplary high yield substrate assembly 300, in accordance with embodiments of the present invention. High yield substrate assembly 300 comprises plurality of piggyback substrates 230 bonded together. In accordance with embodiments of the present invention, carrier substrate 210 or 220 and optional decoupling layer 250 may be present. In the embodiment of FIG. 3, high yield substrate assembly 300 has been separated from carrier substrate 210 or 220 and optional decoupling layer 250.

In accordance with embodiments of the present invention, high yield substrate assembly 300 (FIG. 3) and high yield substrate assembly 100 (FIG. 1B) may be larger, e.g., have a greater diameter, than conventional substrates comprising the same material. For example, wafers grown using materials other than Silicon are generally only available in relatively small wafer sizes, for a variety of reasons including crystal growth characteristics, defect propagation, mechanical strength and the like. For example, such non-Silicon wafers are generally not available in sizes over 100 mm.

In contrast, the current state of the art fabrication facilities utilize 200 mm ("8 inch") to 300 mm ("12 inch") diameter wafers. In general, a fabrication facility and a fabrication process are more efficient, e.g., produce more integrated circuits in less time and/or at a lower cost, using a larger wafer size.

In accordance with embodiments of the present invention, high yield substrate assembly 300 (FIG. 3) and high yield substrate assembly 100 (FIG. 1B) may have a diameter or width that is suitable for processing on fabrication equipment that is sized, e.g., for 200 mm to 300 mm, or larger, wafers. In this novel manner, integrated circuits utilizing non-Silicon substrates may benefit from fabrication processes and equipment designed to handle larger wafers, and may enable higher throughput and lower cost processing, in comparison to the conventional art.

For example, neither high yield substrate assembly 300 (FIG. 3) nor high yield substrate assembly 100 (FIG. 1B) are characterized as having a continuous surface crystal structure. For example, the trenches 110 (FIG. 1B) interrupt the crystal structure of high yield substrate assembly 100. Similarly, the plurality of piggyback substrates (FIG. 2A) may not have the same crystal structure, and the bonds 240 (FIG. 2B) interrupt any crystal structure. Accordingly, both high yield substrate assembly 300 (FIG. 3) and high yield substrate assembly 100 (FIG. 1B) limit the propagation of defects, and enable the use of larger substrates in semiconductor processing.

Further, the construction of high yield substrate assembly 300 may enable the formation of a substrate that is larger, e.g., in diameter, than can be formed by conventional techniques, e.g., single crystal ingot growth. For example, high yield substrate assembly 300 may be formed to a diameter larger than 300 mm ("12 inches"), even if the component pieces 230 are not Silicon.

Still further, high yield substrate assembly 300 may be rectangular in plan view, for example as shown in generally rectangular carrier substrate 220 of FIG. 2A. Such a shape may enable even greater efficiencies in wafer utilization and semiconductor processing, in comparison to conventional, generally round, wafers.

The high yield substrate assemblies, 100 or 300, are suitable for formation of integrated circuits, for example, light emitting diodes or lasers, optical waveguides, radio-frequency circuits, power control circuitry, low power circuitry or radiation hardened circuitry, thereon.

Figure 4A:
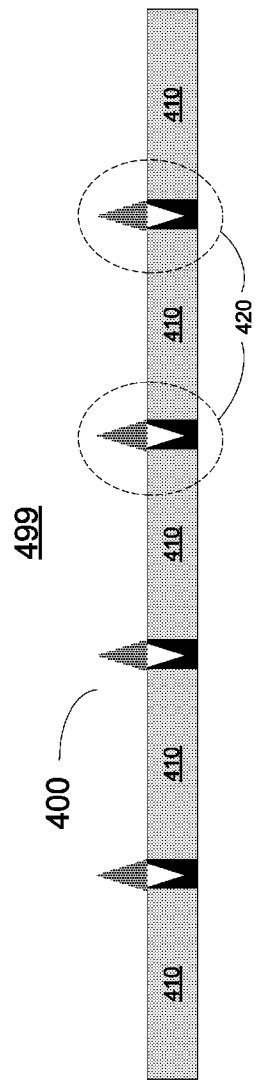

FIGS. 4A-4D illustrate an exemplary method 499 of manufacturing a plurality of Gallium Nitride (GaN) based light emitting diodes on sapphire portions of a high yield substrate assembly, in accordance with embodiments of the present invention. As illustrated in FIG. 4A, a high yield substrate assembly 400 comprises a plurality of sapphire regions 410 separated by separations 420. The sapphire regions 410 may comprise piggyback substrates 230 (FIG. 2A) or portions of high yield substrate assembly 100 between trenches 110 (FIG. 1B), lines 120 (FIG. 1C) or ridges 130 (FIG. 1D). The separations 420 may comprise bonds 240 (FIG. 2B), trenches 110 (FIG. 1B), lines 120 (FIG. 1C) or ridges 130 (FIG. 1D). For example, high yield substrate assembly 400 generally corresponds to high yield substrate assembly 100 (FIG. 1A) or to high yield substrate assembly 300 (FIG. 3).

Generally, separations 420 may form a rectilinear grid, but that is not required. Any suitable pattern, including non-regular patterns and non-periodic patterns, e.g., Penrose tiling, are well suited for separations 420, in accordance with embodiments of the present invention. The regions bounded by separations 420 may have any suitable shape, including a plurality of different shapes, e.g., a mixture of different shapes, in accordance with embodiments of the present invention.

Figure 4B:
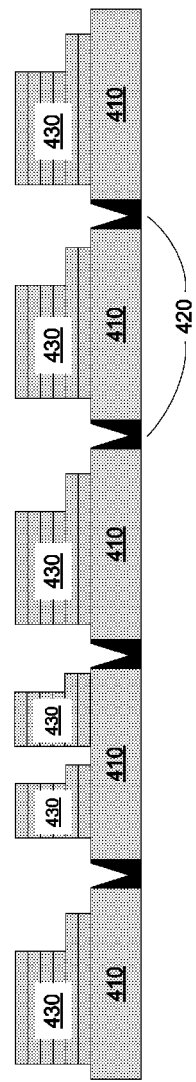

As illustrated in FIG. 4B, a GaN buffer layer, which may be undoped, is formed on sapphire regions 410 of high yield substrate assembly 400. An n-type GaN contact layer is formed on the buffer layer. An optional n-type AlGaN cladding layer may be formed on the contact layer. A p-type InGaN active layer is formed on the cladding layer. The active layer may also be a multiple quantum well (MQW) structure which is responsible for light emission, for example, a MQW comprising InGaN/GaN units that emit blue light. A p-type AlGaN cladding layer of electron blocking layer (EBL) is formed on the active layer, and a p-type GaN contact layer is formed on the cladding layer. The stack may be annealed in a Nitrogen atmosphere at about 700° C., forming a plurality of blue LEDs 430. Electrodes (anodes and cathodes) are added to contact the integrated circuit devices. The embodiment of ridges 130, as shown in FIG. 4A, is not illustrated for clarity.

FIG. 4C illustrates the addition of a carrier substrate 440 to the top, in the perspective of FIG. 4B, of the plurality of blue LEDs 430, formed on high yield substrate assembly 400. Carrier substrate 440 may comprise any suitable material. Carrier substrate 440 comprises through vias and plating 450 and 451 to contact the electrodes of the plurality of blue LEDs 430. The embodiment of ridges 130, as shown in FIG. 4A, is not illustrated for clarity.

As illustrated in FIG. 4D, the plurality of blue LEDs 430 and the carrier substrate 440 are separated from the high yield substrate assembly 400 via any suitable process, for example, a laser lift off (LLO) process. This results in a partial LED assembly comprising the plurality of blue LEDs 430 and the carrier substrate 440, as illustrated in FIG. 4D, and the separated high yield substrate assembly 400, as illustrated in FIG. 4A. The embodiment of ridges 130, as shown in FIG. 4A, is not illustrated for clarity.

Co-pending, commonly-owned U.S. patent application Ser. No. 13/299,672, entitled, "Front Facing Piggyback Wafer Assembly," filed Oct. 18, 2011 to Mohammed et al., incorporated herein by reference in its entirety, illustrates additional processing that may proceed from the structure of FIG. 4D to produce packaged LED devices. Such processing may include, for example, filling with refraction index-matching materials, addition of lens(es), addition of phosphor, packaging, addition of package contacts, singulation and the like.

In accordance with embodiments of the present invention, a variety of integrated circuit devices, e.g., light emitting diodes or lasers, optical waveguides, radio-frequency circuits, power control circuitry, low power circuitry or radiation hardened circuitry, and the like may be formed between separations 420. Further, a plurality of integrated circuit devices may be formed between separations 420. For example, embodiments in accordance with the present invention are well-suited to the formation of more than one integrated circuit device between adjacent separations 420.

In accordance with embodiments of the present invention, high yield substrate assembly 400 may be reused after separation from the plurality of blue LEDs 430 and the carrier substrate 440. For example, method 499 may be repeated on the same high yield substrate assembly 400.

Embodiments in accordance with the present invention provide systems and methods for high yield substrate assemblies. In addition, embodiments in accordance with the present invention provide systems and methods for high yield substrate assemblies that enable relatively smaller substrates to benefit from process machinery optimized for larger substrates. Further, embodiments in accordance with the present invention provide systems and methods for high yield substrate assemblies that are compatible and complementary with existing systems and methods of integrated circuit design, manufacturing and test.

Various embodiments of the invention are thus described. While the present invention has been described in particular embodiments, it should be appreciated that the invention should not be construed as limited by such embodiments, but rather construed according to the below claims.

What is claimed is:

1. A method comprising:
   creating a plurality of structures to a surface of a substrate to form a substrate assembly, the substrate comprised of a first material;
   forming a layer of crystalline material on the entire said surface, wherein said crystalline material accesses a crystal pattern of said substrate, the crystalline material layer comprised of a second material different from the first material; and
   processing, after said creating, said substrate assembly to produce a plurality of integrated circuit devices on said crystalline material, wherein said plurality of structures localize a lattice mismatch or coefficient of thermal expansion mismatch characteristic at the interface between the first and second material, and comprise substrate material that is characterized as amorphous.

2. The method of claim 1 wherein said plurality of structures are operable to relieve thermal stress across said substrate during said processing.

3. The method of claim 1 wherein said creating comprises heating a portion of said surface.

4. The method of claim 1 wherein said plurality of structures interrupt a crystal structure of said surface.

5. The method of claim 1 wherein said creating comprises mechanically sawing said surface.

6. The method of claim 1 wherein said creating comprises a chemical etching of said surface.

7. The method of claim 1 wherein said creating comprises removing material from said surface via a laser.

8. The method of claim 1 wherein said creating comprises removing material from said surface via an ion beam.

9. The method of claim 1 wherein at least two of said plurality of integrated circuit devices are formed between adjacent instances of said plurality of structures.

10. The method of claim 1 wherein said plurality of structures are created above said surface of said substrate.

11. The method of claim 10 wherein said crystalline material is formed over said plurality of structures.

12. A method comprising:
    creating a plurality of structures to a surface of a substrate to form a substrate assembly, the substrate comprised of a first material;
    forming a layer of crystalline material on the entire said surface, wherein said crystalline material accesses a crystal pattern of said substrate, the crystalline material layer comprised of a second material different from the first material; and
    processing, after said creating, said substrate assembly to produce a plurality of integrated circuit devices on said crystalline material, wherein said plurality of structures localize a lattice mismatch or coefficient of thermal expansion mismatch characteristic at the interface between the first and second material, wherein said plurality of structures are created above said surface of said substrate.

13. The method of claim 12 wherein said plurality of structures are operable to relieve thermal stress across said substrate during said processing.

14. The method of claim 12 wherein said creating comprises heating a portion of said surface.

15. The method of claim 12 wherein said creating comprises mechanically sawing said surface.

16. The method of claim 12 wherein said creating comprises a chemical etching of said surface.

17. The method of claim 12 wherein said creating comprises removing material from said surface via a laser.

18. The method of claim 12 wherein said creating comprises removing material from said surface via an ion beam.

19. The method of claim 12 wherein at least two of said plurality of integrated circuit devices are formed between adjacent instances of said plurality of structures.

20. The method of claim 12 wherein said plurality of structures comprise amorphous material.

21. The method of claim 12 wherein said crystalline material is formed over said plurality of structures.

* * * * *